(12) United States Patent
Inoue et al.

(10) Patent No.: US 7,897,987 B2
(45) Date of Patent: Mar. 1, 2011

(54) LIGHT-EMITTING DEVICE INCLUDING LIGHT-EMITTING DIODE AND STACKED LIGHT-EMITTING PHOSPHOR LAYERS

(75) Inventors: Mitsuhiro Inoue, Aichi (JP); Kenji Ito, Nagoya (JP); Kazuyohi Tomita, Nagoya (JP); Tetsu Kachi, Nagoya (JP); Takahiro Kozawa, Nagoya (JP); Satoru Kato, Nagoya (JP); Tadashi Ichikawa, Nagoya (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 0 days.

(21) Appl. No.: 12/382,040

(22) Filed: Mar. 6, 2009

(65) Prior Publication Data

US 2009/0242917 A1    Oct. 1, 2009

(30) Foreign Application Priority Data

Mar. 28, 2008    (JP) .............................. 2008-087591

(51) Int. Cl.
*H01L 33/00*    (2010.01)
(52) U.S. Cl. ........................................ 257/98; 257/100
(58) Field of Classification Search ................... 257/98, 257/89, 100, 99
See application file for complete search history.

(56) References Cited

U.S. PATENT DOCUMENTS 6,791,259 B1 * 9/2004 Stokes et al. ................. 313/503
7,058,103 B2 * 6/2006 Ishida et al. .............. 372/43.01
2005/0057145 A1 * 3/2005 Shieh et al. .................. 313/503
2006/0138435 A1 * 6/2006 Tarsa et al. ..................... 257/89
2007/0278935 A1 * 12/2007 Harada ........................ 313/503
2009/0039375 A1 * 2/2009 LeToquin et al. ............. 257/98

FOREIGN PATENT DOCUMENTS

JP    2005-277127    10/2005
JP    2007-201301    8/2007

* cited by examiner

*Primary Examiner*—Wai-Sing Louie
*Assistant Examiner*—Bilkis Jahan
(74) *Attorney, Agent, or Firm*—McGinn IP Law Group, PLLC

(57) ABSTRACT

A light-emitting device includes a light-emitting diode, a red light-emitting phosphor layer, a yellow light-emitting phosphor layer, and a blue light-emitting phosphor layer. These layers are stacked in the stacking sequence of the yellow, blue, and red phosphor layers in order of increasing distance from the LED. The stacking sequence of the yellow and blue phosphor layers is first determined in such a manner that these layers do not interact with each other. The stacking sequence of the red and yellow phosphor layers and the stacking sequence of the red and blue phosphor layers are determined by the discriminant D. This determination of the stacking sequence suppresses a reduction in the conversion efficiency of the phosphors due to concentration quenching, improving the emission efficiency of the light-emitting device.

16 Claims, 2 Drawing Sheets

LIGHT-EMITTING DEVICE INCLUDING LIGHT-EMITTING DIODE AND STACKED LIGHT-EMITTING PHOSPHOR LAYERS

BACKGROUND OF THE INVENTION

Field of the Invention

The present invention relates to a light-emitting device including a light-emitting diode (hereinafter, referred to as an "LED") and a plurality of stacked phosphor layers, the light-emitting device being configured to emit light having a color different from that of light emitted from the LED.

In recent years, white-light-emitting devices including LEDs have been actively developed for general illumination applications.

It has been reported that a white-light-emitting devices including an LED has an LED configured to emit ultraviolet light and a plurality of phosphors excited by irradiation with ultraviolet light to emit light having colors different from each other, e.g., red, green, and blue, and emits white light by mixing colors of light emitted from the phosphors.

In the case of using different types of phosphors, the interaction among these phosphors is an issue. This is a phenomenon in which light emitted from one phosphor is absorbed by another phosphor. For example, in the case of a mixture of a blue phosphor and a yellow phosphor, the blue light emitted from the blue phosphor is absorbed by the yellow phosphor, reducing the efficiency.

To prevent the interaction among phosphors, Japanese Unexamined Patent Application Publication No. 2005-277127 discloses a light-emitting device including an LED, the light-emitting device having a structure in which different phosphor layers containing different phosphors are stacked and in which the phosphor layer emitting longer-wavelength light is closer to the LED than the phosphor layer emitting shorter-wavelength light. For example, in the case of using a red phosphor emitting red light, a green phosphor emitting green light, and a blue phosphor emitting blue light, the stacking sequence of the red, green, and blue phosphors in order of increasing distance from the LED is used.

Japanese Unexamined Patent Application Publication No. 2007-201301 discloses a light-emitting device including an LED and phosphors emitting red, green, and blue light, the phosphors being stacked in the stacking sequence described above, in which the concentration of the red phosphor is the lowest and the concentration of the blue phosphor is the highest. The concentrations of the phosphors are determined because the intensity of the ultraviolet light from the LED decreases with increasing distance from the LED. This permits efficient absorption of ultraviolet light, thus resulting in uniform red, green, and blue light emission.

In phosphors, a phenomenon in which the conversion efficiency is reduced at their higher concentrations, referred to as "concentration quenching", is observed. In Japanese Unexamined Patent Application Publication Nos. 2005-277127 and 2007-201301, however, the stacking sequence of the phosphors is determined out of consideration of concentration quenching. Thus, in some cases, each light-emitting device including the LED has reduced luminous efficiency as a whole.

SUMMARY OF THE INVENTION

Accordingly, it is an object of the present invention to provide a light-emitting device including an LED, the light-emitting device having a higher luminous efficiency by determining the stacking sequence of phosphor layers in view of the concentration quenching of phosphors. It is another object of the present invention to provide a method for determining the stacking sequence of phosphor layers.

According to an embodiment of the present invention, a light-emitting device includes a light-emitting diode and a plurality of stacked phosphor layers, each of the phosphor layers being configured to emit light having a color different from the color of light emitted from another phosphor layer, and the stacking sequence of the plurality of phosphor layers being a sequence such that phosphors constituting the phosphor layers do not interact with each other, in which among the phosphor layers, any two phosphor layers A and B that do not interact with each other are arranged in such a manner that the phosphor layer A is further from the light-emitting diode than the phosphor layer B when a discriminant D>1 and that the phosphor layer B is further from the light-emitting diode than the phosphor layer A when the discriminant D<1, and the discriminant D is given by $$D = k_B + (k_A - k_B)/B + (1 - k_A)/AB$$

where $k_A$ represents the rate of reduction in the conversion efficiency of the phosphor layer A when the stacking sequence of the phosphor layers A and B is changed from the stacking sequence of the phosphor layers A and B to the stacking sequence of the phosphor layers B and A in order of increasing distance from the light-emitting diode; $k_B$ represents the rate of reduction in the conversion efficiency of the phosphor layer B when the stacking sequence of the phosphor layers A and B is changed from the stacking sequence of the phosphor layers A and B to the stacking sequence of the phosphor layers B and A in order of increasing distance from the light-emitting diode; A represents the ratio of the intensity of excitation light transmitted through the phosphor layer A to the intensity of excitation light incident on the phosphor layer A; and B represents the ratio of the intensity of excitation light transmitted through the phosphor layer B to the intensity of excitation light incident on the phosphor layer B, with the proviso that each of the phosphor layers A and B has a phosphor content such that the emission intensity is unchanged when the stacking sequence of the phosphor layers A and B is changed. $k_A$, $k_B$, A, and B depend on the phosphor contents. A reduction in conversion efficiency is attributed to concentration quenching.

Here, the term "interact" is used to indicate that light emitted from one phosphor is absorbed by another phosphor.

According to another embodiment of the present invention, the light-emitting device described in the foregoing embodiment is characterized in that the LED preferably is configured to emit ultraviolet light.

According to another embodiment of the present invention, the light-emitting device described in one of the foregoing embodiments is characterized in that the colors of light emitted from the phosphor layers are mixed together to form white.

In this case, the phosphor layers are preferably a red phosphor layer configured to emit red light, a yellow phosphor layer configured to emit yellow light, and a blue phosphor layer configured to emit blue light. Preferably, a yellow phosphor layer configured to emit yellow light, a blue phosphor layer configured to emit blue light and a red phosphor layer configured to emit red light are disposed in order of increasing distance from the light-emitting diode.

According to another embodiment of the present invention, a method for determining the stacking sequence of phosphor layers of a light-emitting device including a light-emitting diode and a plurality of stacked phosphor layers, each of the phosphor layers being configured to emit light having a color different from the color of light emitted from another phosphor layer, and the stacking sequence of the phosphor layers being a sequence such that phosphors constituting the phosphor layers do not interact with each other, the method including determining the stacking sequence of any two phosphor layers A and B that do not interact with each other among the phosphor layers in such a manner that the phosphor layer A is further from the light-emitting diode than the phosphor layer B when a discriminant D>1 and that the phosphor layer B is further from the light-emitting diode than the phosphor layer A when the discriminant D<1, in which the discriminant D is given by $$D=k_B+(k_A-k_B)/B+(1-k_A)/AB$$

where $k_A$ represents the rate of reduction in the conversion efficiency of the phosphor layer A when the stacking sequence of the phosphor layers A and B is changed from the stacking sequence of the phosphor layers A and B to the stacking sequence of the phosphor layers B and A in order of increasing distance from the light-emitting diode; $k_B$ represents the rate of reduction in the conversion efficiency of the phosphor layer B when the stacking sequence of the phosphor layers A and B is changed from the stacking sequence of the phosphor layers A and B to the stacking sequence of the phosphor layers B and A in order of increasing distance from the light-emitting diode; A represents the ratio of the intensity of excitation light transmitted through the phosphor layer A to the intensity of excitation light incident on the phosphor layer A; and B represents the ratio of the intensity of excitation light transmitted through the phosphor layer B to the intensity of excitation light incident on the phosphor layer B, with the proviso that each of the phosphor layers A and B has a phosphor content such that the emission intensity is unchanged when the stacking sequence of the phosphor layers A and B is changed.

The light-emitting device including the LED according to an embodiment of the present invention has the optimized stacking sequence of the plurality of phosphors in view of concentration quenching and thus has high luminous efficiency. In the light-emitting device according to the foregoing embodiment in which the phosphor layers are a red phosphor layer configured to emit red light, a yellow phosphor layer configured to emit yellow light, and a blue phosphor layer configured to emit blue light, since white light is obtained by mixing red, yellow, and blue light, the light-emitting device has high color rendering properties and high luminous efficiency.

DESCRIPTION OF THE PREFERRED EMBODIMENTS

While specific embodiments of the present invention will be described below with reference to the attached drawings, the present invention is not limited to the embodiments.

First Embodiment

Figure 1:
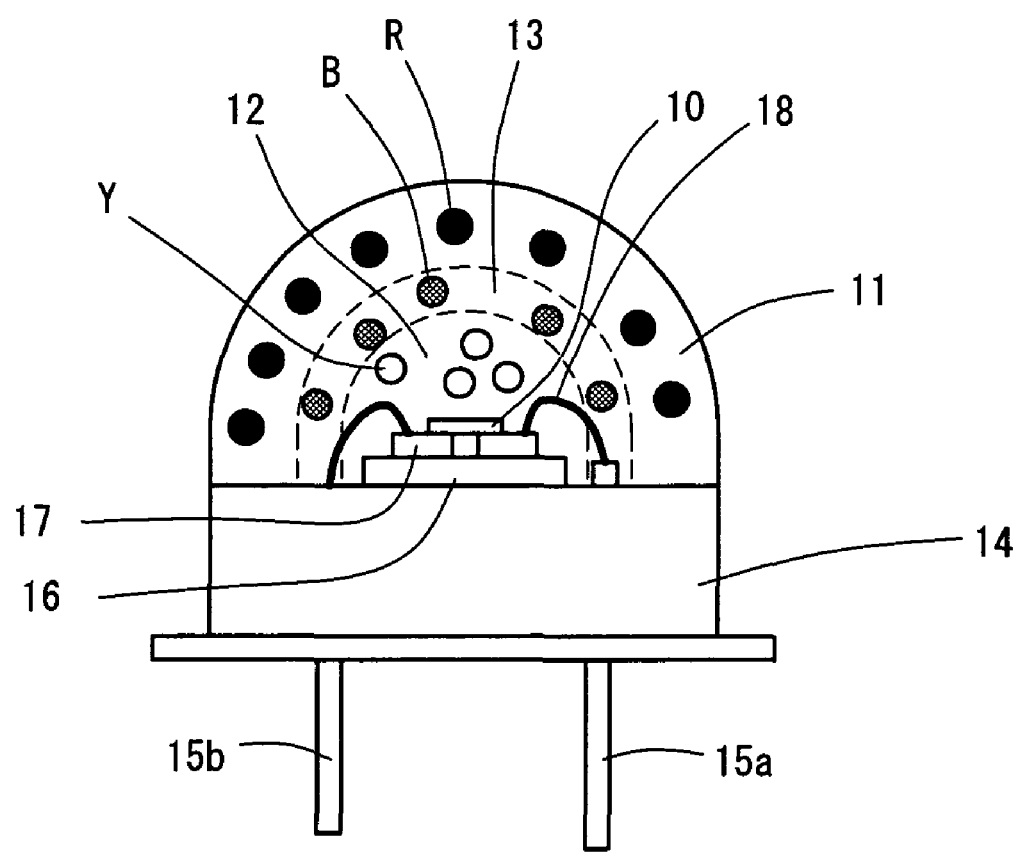
FIG. 1 illustrates a structure of a light-emitting device including an LED according to a first embodiment.

FIG. 1 illustrates a structure of a light-emitting device including an LED according to a first embodiment. The light-emitting device includes an LED 10 configured to emit ultraviolet light, a red phosphor layer 11, a yellow phosphor layer 12, a blue phosphor layer 13, a metal stem 14, leads 15a and 15b, and a submount 16.

The LED 10 is a flip-chip element composed of the Group III nitride semiconductor and emits ultraviolet light having a wavelength of 395 nm. The LED 10 is mounted on the submount 16 by flip-chip bonding. Electrodes of the LED 10 are bonded to an electrode pattern 17 arranged on the submount 16 by soldering. The submount 16 is mounted on the metal stem 14. The electrode pattern on the submount 16 is connected to the leads 15a and 15b with wires 18.

The red phosphor layer 11, the yellow phosphor layer 12, and the blue phosphor layer 13 are stacked on the LED 10. The resulting stack has a dome shape. The yellow phosphor layer 12, the blue phosphor layer 13, and the red phosphor layer 11 in order of increasing distance from the LED 10 are arranged. This stacking sequence results in an increase in the efficiency of the light-emitting device including the LED.

The red phosphor layer 11 is formed of an epoxy resin layer containing a red phosphor R excited by ultraviolet light to emit red light. The red phosphor R is composed of $Ba_3MgSi_2O_8:Eu^{2+},Mn^{2+}$. The peak wavelength of the emission spectrum is about 630 nm. In the red phosphor layer 11, the weight ratio of the red phosphor R to the epoxy resin is 0.16.

The yellow phosphor layer 12 is formed of an epoxy resin layer containing a yellow phosphor Y excited by ultraviolet light to emit yellow light. The yellow phosphor Y is composed of $(Br,Sr)_2SiO_4:Eu^{2+}$. The peak wavelength of the emission spectrum is about 560 nm. In the yellow phosphor layer 12, the weight ratio of the yellow phosphor Y to the epoxy resin is 0.01.

The blue phosphor layer 13 is formed of an epoxy resin layer containing a blue phosphor B excited by ultraviolet light to emit blue light. The blue phosphor B is composed of $BaMg_{1+x}Al_{10+y}O_{17}:Eu^{2+}$. The peak wavelength of the emission spectrum is about 450 nm. In the blue phosphor layer 13, the weight ratio of the blue phosphor B to the epoxy resin is 0.018.

The red phosphor layer 11, the yellow phosphor layer 12, and the blue phosphor layer 13 are each formed of the epoxy resin layer containing a corresponding one of the phosphors. Alternatively, each of the phosphor layers may be formed of a silicone resin layer containing a corresponding one of the phosphors.

The stack of the phosphor layers is formed as follows. An epoxy resin containing the red phosphor R, an epoxy resin containing the yellow phosphor Y, and an epoxy resin containing the blue phosphor B are prepared. Dome-shaped molds having different sizes are also prepared. The yellow phosphor Y-containing epoxy resin is charged into the smallest mold. The blue phosphor B-containing epoxy resin is charged into the second-smallest mold. The red phosphor R-containing epoxy resin is charged into the largest mold. The part of the LED 10 and the submount 16 mounted on the metal stem 14 is dipped in these molds in order of size from smallest to largest and cured by heat treatment to form the structure in which the yellow phosphor layer 12, the blue phosphor layer 13, and the red phosphor layer 11 in order of increasing distance from the LED 10 are stacked.

The stacking sequence of the phosphor layers of the light-emitting device including the LED is determined as described below.

To prevent a reduction in the luminous efficiency of the light-emitting device including the LED, it is necessary to provide a stacking sequence such that the phosphor layers do not interact with each other. Here, the term "interact" is used to indicate that light emitted from one phosphor is absorbed by another phosphor.

The yellow phosphor Y interacts with the blue phosphor B. That is, blue light emitted from the blue phosphor B is absorbed by the yellow phosphor Y. Meanwhile, yellow light emitted from the yellow phosphor Y and blue light emitted from the blue phosphor B are not absorbed by the red phosphor R.

It is necessary to provide a stacking sequence such that the yellow phosphor layer 12 is closer to the LED 10 than the blue phosphor layer 13.

Next, the stacking sequence of the red phosphor layer 11 and the yellow phosphor layer 12 and the stacking sequence of the red phosphor layer 11 and the blue phosphor layer 13 will be determined.

In phosphors, a phenomenon in which the conversion efficiency is reduced at their higher concentrations, referred to as "concentration quenching", is observed. The rate of reduction in conversion efficiency due to concentration quenching depends on the type of phosphor. Thus, the stacking sequence of layers that do not interact with each other is determined by the discriminant D in view of concentration quenching. The discriminant D is derived as described below.

In the case where two types of phosphors A and B that do not interact with each other, the stacking sequence of a layer A containing the phosphor A and a layer B containing the phosphor B will be discussed. Here, the term "phosphor B" used for explanation of the derivation of the discriminant D is used to indicate any phosphor different from the phosphor A and not limited to the foregoing blue phosphor B incorporated in the blue phosphor layer 13.

Suppose the layers A and B are arranged in the stacking sequence of the layers A and B in order of increasing distance from an excitation light source. In this case, the emission intensity $P_A$ of the layer A is obtained by multiplying the conversion efficiency $\eta_A$ of the layer A by the intensity of excitation light absorbed by the layer A. The intensity of the excitation light transmitted through the layer A is given by $P_0 \exp(-\alpha_A d_A)$, where $P_0$ represents the intensity of the excitation light; $\alpha_A$ represents the absorption coefficient of the layer A; and $d_A$ represents the thickness of the layer A. Let the rate of the excitation light transmitted through the layer A, i.e., $\exp(-\alpha_A d_A)$, be A, the intensity of the excitation light absorbed by the layer A is given by $P_0(1-A)$. The emission intensity $P_A$, therefore, is given by $$P_A = \eta_A P_0 (1-A) \quad (1)$$

$\eta_A$ and $\alpha_A$ depend on the concentration of the phosphor A in the layer A.

The emission intensity $P_B$ of the layer B is obtained by multiplying the conversion efficiency $\eta_B$ of the layer B by the intensity of excitation light absorbed by the layer B. The intensity of the excitation light transmitted through the layer B is obtained by multiplying the intensity of the excitation light transmitted through the layer A by the rate of the excitation light transmitted through the layer B, i.e., $\exp(-\alpha_B d_B)$, where $\alpha_B$ represents the absorption coefficient of the layer B; and $d_B$ represents the thickness of the layer B. Let $\exp(-\alpha_B d_B)$ be B, the intensity of the excitation light transmitted through the layer B is given by $P_0 AB$. The intensity of the excitation light absorbed by the layer B is given by $P_0 A(1-B)$. The emission intensity $P_B$, therefore, is given by $$P_B = \eta_B P_0 A(1-B) \quad (2)$$

$\eta_B$ and $\alpha_B$ depend on the concentration of the phosphor B in the layer B.

Also in the case where the stacking sequence of the layers A and B is changed into the stacking sequence of the layers B and A in order of increasing distance from the excitation light source, the emission intensity of the layer B, $P_B'$, and the emission intensity of the layer A, $P_A'$, are given by $$P_B' = \eta_B' P_0 (1-B') \quad (3)$$

$$P_A' = \eta_A' P_0 B'(1-A') \quad (4)$$

where $\eta_A'$ and $\eta_B'$ represent conversion efficiencies of the layers A and B, respectively; and A' and B' represent rates of the excitation light transmitted through the layers A and B, respectively, and are given by $A' = \exp(-\alpha_A' d_A)$ and $B' = \exp(-\alpha_B' d_B)$, where $\alpha_A'$ and $\alpha_B'$ represent absorption coefficients of the layers A and B, respectively.

Suppose each of the layers A and B has a phosphor content such that the emission intensity of the layers A and B is unchanged when the stacking sequence of the layers A and B is changed. That is, the phosphor contents of the layers A and B is values satisfying $$P_A = P_A' \text{ and } P_B = P_B' \quad (5)$$

From equations (1) to (5), A' and B' are given by $$A' = 1 - \{k_A(1-A)\}/\{1 - k_B A(1-B)\} \quad (6)$$

$$B' = 1 - k_B A(1-B) \quad (7)$$

wherein $k_A$ and $k_B$ represent rates of reduction in the conversion efficiency of the layers A and B due to concentration quenching and are given by $k_A = \eta_A/\eta_A'$ and $k_B = \eta_B/\eta_B'$.

Here, AB indicates the rate of the excitation light transmitted through the layers A and B arranged in the stacking sequence of the layers A and B in order of increasing distance from the excitation light source. B'A' indicates the rate of the excitation light transmitted through the layers A and B arranged in the stacking sequence of the layers B and A in order of increasing distance from the excitation light source. Thus, the larger one of AB and B'A' provides the same spectrum by irradiation with a smaller amount of excitation light. That is, the stacking sequence of the layers A and B of the larger one of AB and B'A' provides higher efficiency.

Consequently, let the discriminant D be B'A'/AB, the discriminant D is given by $$D = k_B + (k_A - k_B)/B + (1 - k_A)/(AB) \quad (8)$$

To obtain higher efficiency, this equation demonstrates that the layers A and B are arranged in the stacking sequence of the layers B and A in order of increasing distance from the excitation light source when D>1 and that the layers A and B are arranged in the stacking sequence of the layers A and B in order of increasing distance from the excitation light source when D<1.

The stacking sequence of the red phosphor layer 11 and the yellow phosphor layer 12 is determined by the resulting discriminant D.

The rate of the ultraviolet light transmitted through each individual phosphor layer is measured. When the weight ratio of the red phosphor R to the epoxy resin of the red phosphor layer 11 is 0.06, the rate R of ultraviolet light transmitted through the red phosphor layer 11 is 0.45. Similarly, when the weight ratio of the yellow phosphor Y to the epoxy resin of the yellow phosphor layer 12 is 0.03, the rate Y of ultraviolet light transmitted through the yellow phosphor layer 12 is 0.48. When the weight ratio of the blue phosphor B to the epoxy resin of the blue phosphor layer 13 is 0.1, the rate Y of ultraviolet light transmitted through the blue phosphor layer 13 is 0.28.

To obtain the same spectrum even when the stacking sequence is changed from the stacking sequence of the red phosphor layer 11 and the yellow phosphor layer 12 to the yellow phosphor layer 12 and the red phosphor layer 11 in order of increasing distance from the LED 10, the weight ratio of the red phosphor R to the epoxy resin of the red phosphor layer 11 should be changed from 0.06 to 0.09, and the weight ratio of the yellow phosphor Y to the epoxy resin of the yellow phosphor layer 12 should be changed from 0.03 to 0.01. In this case, the conversion efficiency of the red phosphor layer 11 is unchanged even when the stacking sequence is changed. The conversion efficiency of the yellow phosphor layer 12 increases by a factor of 1.07. The rate of the conversion efficiency of the red phosphor layer 11, i.e., $k_R$, is 1. The rate of the conversion efficiency of the yellow phosphor layer 12, i.e., $k_Y$, is 0.93. In the case of the sequence of the red phosphor layer 11 and the yellow phosphor layer 12, the rate R, i.e., A in Eq. 8 of ultraviolet light transmitted through the red phosphor layer 11 is 0.45, and the rate Y, i.e., B in Eq. 8 of ultraviolet light transmitted through the yellow phosphor layer 12 is 0.48. By replacing $k_R (=k_A$ in Eq. 8), $k_Y (=k_B$ in Eq. 8), R(=A) and Y(=B) by these values in the discriminant D, the equation becomes D=1.08>1. Hence, the stacking sequence of the yellow phosphor layer 12 and the red phosphor layer 11 in order of increasing distance from the LED 10 provides higher efficiency.

Next, the stacking sequence of the red phosphor layer 11 and the blue phosphor layer 13 is determined by the discriminant D.

In the case where the weight ratio of the red phosphor R to the epoxy resin of the red phosphor layer 11 is 0.09, the weight ratio of the blue phosphor B to the epoxy resin of the blue phosphor layer 13 is 0.1, and the red phosphor layer 11 and the blue phosphor layer 13 are arranged in the stacking sequence of the red phosphor layer 11 and the blue phosphor layer 13 in order of increasing distance from the LED 10, in order to obtain the same spectrum even when the stacking sequence is changed to the stacking sequence of the blue phosphor layer 13 and the red phosphor layer 11, the weight ratio of the red phosphor R to the epoxy resin of the red phosphor layer 11 should be changed from 0.09 to 0.16, and the weight ratio of the blue phosphor B to the epoxy resin of the blue phosphor layer 13 should be changed from 0.1 to 0.018. In this case, the rate of the conversion efficiency of the red phosphor layer 11, i.e., $k_R$, is 1.02. The rate of the conversion efficiency of the blue phosphor layer 13, i.e., $k_B$, is 0.88. In the case of the sequence of the red phosphor layer 11 and the blue phosphor layer 13, the rate R, i.e., A in Eq. 8 of ultraviolet light transmitted through the red phosphor layer 11 is 0.30, and the rate B, i.e., B in Eq. 8 of ultraviolet light transmitted through the blue phosphor layer 13 is 0.28. By replacing $k_R (=k_A$ in Eq. 8), $k_B (=k_B$ in Eq. 8), R(=A) and B(=B) by these values in the discriminant D, the equation becomes D=1.14>1. Hence, the stacking sequence of the blue phosphor layer 13 and the red phosphor layer 11 in order of increasing distance from the LED 10 provides higher efficiency.

Consequently, the results demonstrate that the stacking sequence achieving the highest emission efficiency is the yellow phosphor layer 12, the blue phosphor layer 13, and the red phosphor layer 11 in order of increasing distance from the LED 10.

Figure 2:
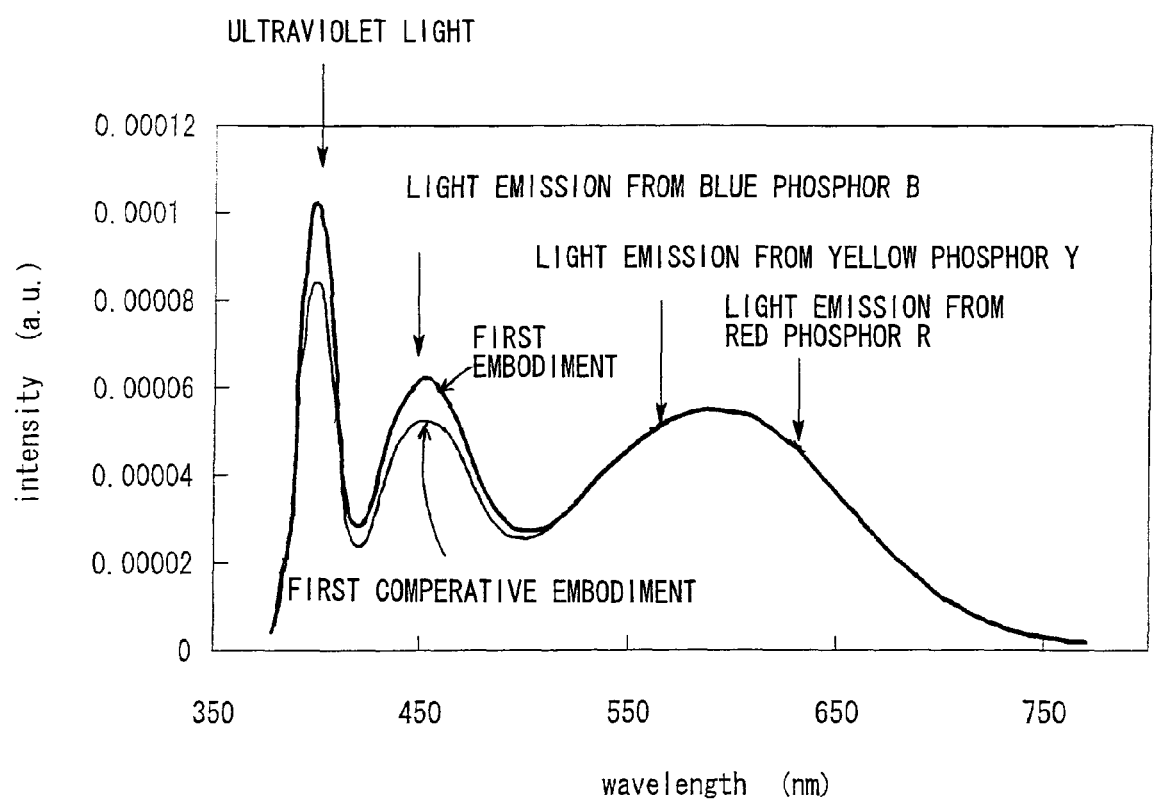
FIG. 2 is a graph showing emission spectra of the light-emitting device including the LED according to the first embodiment and a light-emitting device including an LED according to a first comparative embodiment.

FIG. 2 is a graph showing emission spectra of the light-emitting device including the LED according to the first embodiment and a light-emitting device including an LED according to a first comparative embodiment. The light-emitting device including the LED according to the first comparative embodiment is the same as in the first embodiment, except that the stacking sequence is changed to the stacking sequence of the red phosphor layer, the yellow phosphor layer, and the blue phosphor layer in order of increasing distance from the LED 10. In the graph of FIG. 2, the horizontal axis indicates the wavelength, and the vertical axis indicates the relative intensity. Peak wavelengths of emission spectra of the red phosphor R, the yellow phosphor Y, and the blue phosphor B are indicated by arrows in the graph. The graph demonstrates that the intensity of the excitation ultraviolet light and the emission intensity of the blue phosphor B in the light-emitting device according to the first embodiment is larger than those in the light-emitting device according to the first comparative embodiment and that emission intensities of the red phosphor R and the yellow phosphor Y in the light-emitting device according to the first embodiment is substantially equal to those in the light-emitting device according to the first comparative embodiment. Thus, the light-emitting device including the LED according to the first embodiment and having the yellow phosphor layer 12, the blue phosphor layer 13, and the red phosphor layer 11 stacked in that order has higher efficiency.

As described above, the light-emitting device including the LED according to the first embodiment has the optimized stacking sequence of the phosphor layers and thus has high emission efficiency.

In the foregoing embodiment, three phosphors emitting red, yellow, and blue light are used. The present invention can be applied to the case of using a plurality of phosphors emitting light having different color. For example, also in the case where three phosphors emitting red, green, and blue light or four phosphors emitting red, yellow, green, and blue light are used to emit white light, the present invention can be applied to a high-efficiency light-emitting device including an LED.

In the foregoing embodiment, the light-emitting device including the LED emits white light. Alternatively, the present invention can be applied to a light-emitting device including an LED, the light-emitting device being configured to emit light having a color other than white by mixing colors of light emitted from a plurality of phosphors.

In the foregoing embodiment, the ultraviolet-emitting LED is used. The present invention is not limited to ultraviolet emission. For example, a violet- or blue-emitting LED may be used.

A light-emitting device including an LED according to an embodiment of the present invention can be used as a light source for use in general illumination applications.

What is claimed is:

1. A light-emitting device, comprising:
a light-emitting diode; and
a plurality of stacked phosphor layers, each of the phosphor layers being configured to emit light having a color different from a color of light emitted from another phosphor layer, and a stacking sequence of the plurality of phosphor layers being a sequence such that phosphors constituting the phosphor layers do not interact with each other,
wherein among the phosphor layers, any two phosphor layers A and B that do not interact with each other are arranged in such a manner that the phosphor layer A is further from the light-emitting diode than the phosphor layer B when a discriminant D>1 and that the phosphor layer B is further from the light-emitting diode than the phosphor layer A when the discriminant D<1, and the discriminant D is given by $$D=k_B+(kA-k_B)/B+(1-k_A)/AB$$

where $k_A$ represents a rate of reduction in a conversion efficiency of the phosphor layer A when the stacking sequence of the phosphor layers A and B is changed from a stacking sequence of the phosphor layers A and B to a stacking sequence of the phosphor layers B and A in order of increasing distance from the light-emitting diode; $k_B$ represents a rate of reduction in a conversion efficiency of the phosphor layer B when the stacking sequence of the phosphor layers A and B is changed from the stacking sequence of the phosphor layers A and B to the stacking sequence of the phosphor layers B and A in order of increasing distance from the light-emitting diode; A represents a ratio of an intensity of excitation light transmitted through the phosphor layer A to an intensity of excitation light incident on the phosphor layer A; and B represents a ratio of an intensity of excitation light transmitted through the phosphor layer B to an intensity of excitation light incident on the phosphor layer B, with a proviso that each of the phosphor layers A and B has a phosphor content such that an emission intensity is unchanged when the stacking sequence of the phosphor layers A and B is changed.

2. The light-emitting device according to claim 1, wherein the light-emitting diode is configured to emit ultraviolet light.

3. The light-emitting device according to claim 1, wherein the colors of light emitted from the phosphor layers are mixed together to form white.

4. The light-emitting device according to claim 2, wherein the colors of light emitted from the phosphor layers are mixed together to form white.

5. The light-emitting device according to claim 3, wherein the phosphor layers comprise a red phosphor layer configured to emit red light, a yellow phosphor layer configured to emit yellow light, and a blue phosphor layer configured to emit blue light.

6. The light-emitting device according to claim 4, wherein the phosphor layers comprise a red phosphor layer configured to emit red light, a yellow phosphor layer configured to emit yellow light, and a blue phosphor layer configured to emit blue light.

7. The light-emitting device according to claim 1, wherein a yellow phosphor layer configured to emit yellow light, a blue phosphor layer configured to emit blue light, and a red phosphor layer configured to emit red light are disposed in order of increasing distance from the light-emitting diode.

8. A method for determining the stacking sequence of phosphor layers of a light-emitting device including a light-emitting diode and a plurality of stacked phosphor layers, each of the phosphor layers being configured to emit light having a color different from a color of light emitted from another phosphor layer, and a stacking sequence of the phosphor layers being a sequence such that phosphors constituting the phosphor layers do not interact with each other, the method comprising:

determining the stacking sequence of any two phosphor layers A and B that do not interact with each other among the phosphor layers in such a manner that the phosphor layer A is further from the light-emitting diode than the phosphor layer B when a discriminant D>1 and that the phosphor layer B is further from the light-emitting diode than the phosphor layer A when the discriminant D<1, wherein the discriminant D is given by $$D=k_B+(kA-k_B)/B+(1-k_A)/AB$$

where $k_A$ represents a rate of reduction in a conversion efficiency of the phosphor layer A when the stacking sequence of the phosphor layers A and B is changed from a stacking sequence of the phosphor layers A and B to a stacking sequence of the phosphor layers B and A in order of increasing distance from the light-emitting diode; $k_B$ represents a rate of reduction in a conversion efficiency of the phosphor layer B when the stacking sequence of the phosphor layers A and B is changed from the stacking sequence of the phosphor layers A and B to the stacking sequence of the phosphor layers B and A in order of increasing distance from the light-emitting diode; A represents a ratio of an intensity of excitation light transmitted through the phosphor layer A to an intensity of excitation light incident on the phosphor layer A; and B represents a ratio of an intensity of excitation light transmitted through the phosphor layer B to an intensity of excitation light incident on the phosphor layer B, with a proviso that each of the phosphor layers A and B has a phosphor content such that an emission intensity is unchanged when the stacking sequence of the phosphor layers A and B is changed.

9. The method for determining the stacking sequence of phosphor layers of a light-emitting device according to claim 8, wherein the light-emitting diode is configured to emit ultraviolet light.

10. The method for determining the stacking sequence of phosphor layers of a light-emitting device according to claim 8, wherein the colors of light emitted from the phosphor layers are mixed together to form white.

11. The method for determining the stacking sequence of phosphor layers of a light-emitting device according to claim 9, wherein the colors of light emitted from the phosphor layers are mixed together to form white.

12. The method for determining the stacking sequence of phosphor layers of a light-emitting device according to claim 9, wherein the phosphor layers comprise a red phosphor layer configured to emit red light, a yellow phosphor layer configured to emit yellow light, and a blue phosphor layer configured to emit blue light.

13. The method for determining the stacking sequence of phosphor layers of a light-emitting device according to claim 8, wherein the phosphor layers comprise a yellow phosphor layer configured to emit yellow light, a blue phosphor layer configured to emit blue light, and a red phosphor layer configured to emit red light disposed in order of increasing distance from the light-emitting diode.

14. The method for determining the stacking sequence of phosphor layers of a light-emitting device according to claim 9, wherein the phosphor layers comprise a yellow phosphor layer configured to emit yellow light, a blue phosphor layer configured to emit blue light, and a red phosphor layer configured to emit red light disposed in order of increasing distance from the light-emitting diode.

15. The method for determining the stacking sequence of phosphor layers of a light-emitting device according to claim 10, wherein the phosphor layers comprise a yellow phosphor layer configured to emit yellow light, a blue phosphor layer configured to emit blue light, and a red phosphor layer configured to emit red light disposed in order of increasing distance from the light-emitting diode.

16. The method for determining the stacking sequence of phosphor layers of a light-emitting device according to claim 11, wherein the phosphor layers comprise a yellow phosphor layer configured to emit yellow light, a blue phosphor layer configured to emit blue light, and a red phosphor layer configured to emit red light disposed in order of increasing distance from the light-emitting diode.

* * * * *